(12) United States Patent  (10) Patent No.: US 8,278,727 B2
Kautzsch et al.  (45) Date of Patent: Oct. 2, 2012

(54) PRESSURE SENSOR AND METHOD

(75) Inventors: Thoralf Kautzsch, Dresden (DE);
Marco Müller, Pima (DE); Dirk Meinhold, Dresden (DE); Ben Rosam, Dresden (DE); Klaus Elian, Alteglofsheim (DE); Stefan Kolb, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 334 days.

(21) Appl. No.: 12/651,623

(22) Filed: Jan. 4, 2010

(65) Prior Publication Data
US 2011/0163395 A1    Jul. 7, 2011

(51) Int. Cl.
*G01L 9/00*    (2006.01)
(52) U.S. Cl. ............ 257/419; 257/415; 257/E29.324; 977/956
(58) Field of Classification Search .............. None
See application file for complete search history.

(56) References Cited

U.S. PATENT DOCUMENTS
5,531,121 A * 7/1996 Sparks et al. ............... 73/716

OTHER PUBLICATIONS
U.S. Appl. No. 12/208,897 (not yet published).

* cited by examiner

*Primary Examiner* — Benjamin Sandvik
*Assistant Examiner* — Scott R Wilson
(74) *Attorney, Agent, or Firm* — Banner & Witcoff, Ltd.

(57) ABSTRACT

A method for providing a pressure sensor substrate comprises creating a first cavity that extends inside the substrate in a first direction perpendicular to a main surface of the substrate, and that extends inside the substrate, in a second direction perpendicular to the first direction, into a first venting area of the substrate; creating a second cavity that extends in the first direction inside the substrate, that extends in parallel to the first cavity in the second direction, and that does not extend into the first venting area; and opening the first cavity in the first venting area.

26 Claims, 4 Drawing Sheets

PRESSURE SENSOR AND METHOD

BACKGROUND

Pressure sensors are typically used to measure pressure of liquids or gasses and provide an output signal varying with the pressure of the medium. Conventional pressure sensors include stand-alone pressure sensors membranes produced with MEMS techniques (Micro-Electro-Mechanical Structures), coupled to an ASIC. Those membranes are typically created horizontally on the surface of a wafer, which implies complex production methods since multiple process steps are required in order to create a free membrane on top of a semi-conductor substrate. Generally speaking, creating a ventilated volume across a membrane is a complicated task.

SUMMARY

According to some aspects as described herein, two cavities are created, which extend vertically inside a substrate. Both cavities extend also horizontally under the main surface of the substrate, wherein both cavities extend at least partially in parallel to each other in a predetermined direction. However, only the first cavity is created such that it extends horizontally into a venting area of the substrate. The first cavity is then opened to the environment in the venting area of the substrate. Thus, a volume of the first cavity can be coupled to outside pressure, whereas the second cavity provides a reference pressure.

According to further aspects, a pressure sensor substrate is provided, which comprises first and second cavities, which both extend vertically inside the substrate. Both cavities also extend partially in parallel in a horizontally predetermined direction underneath the main surface of the substrate, wherein only the first cavity extends horizontally into a venting area of the substrate. The first cavity is opened to the environment in the venting area.

BRIEF DESCRIPTION OF THE DRAWINGS

Various illustrative embodiments are described herein in connection with the following figures, in which like reference numerals designate corresponding or similar parts, and wherein.

DETAILED DESCRIPTION OF ILLUSTRATIVE EMBODIMENTS

Figure 1:
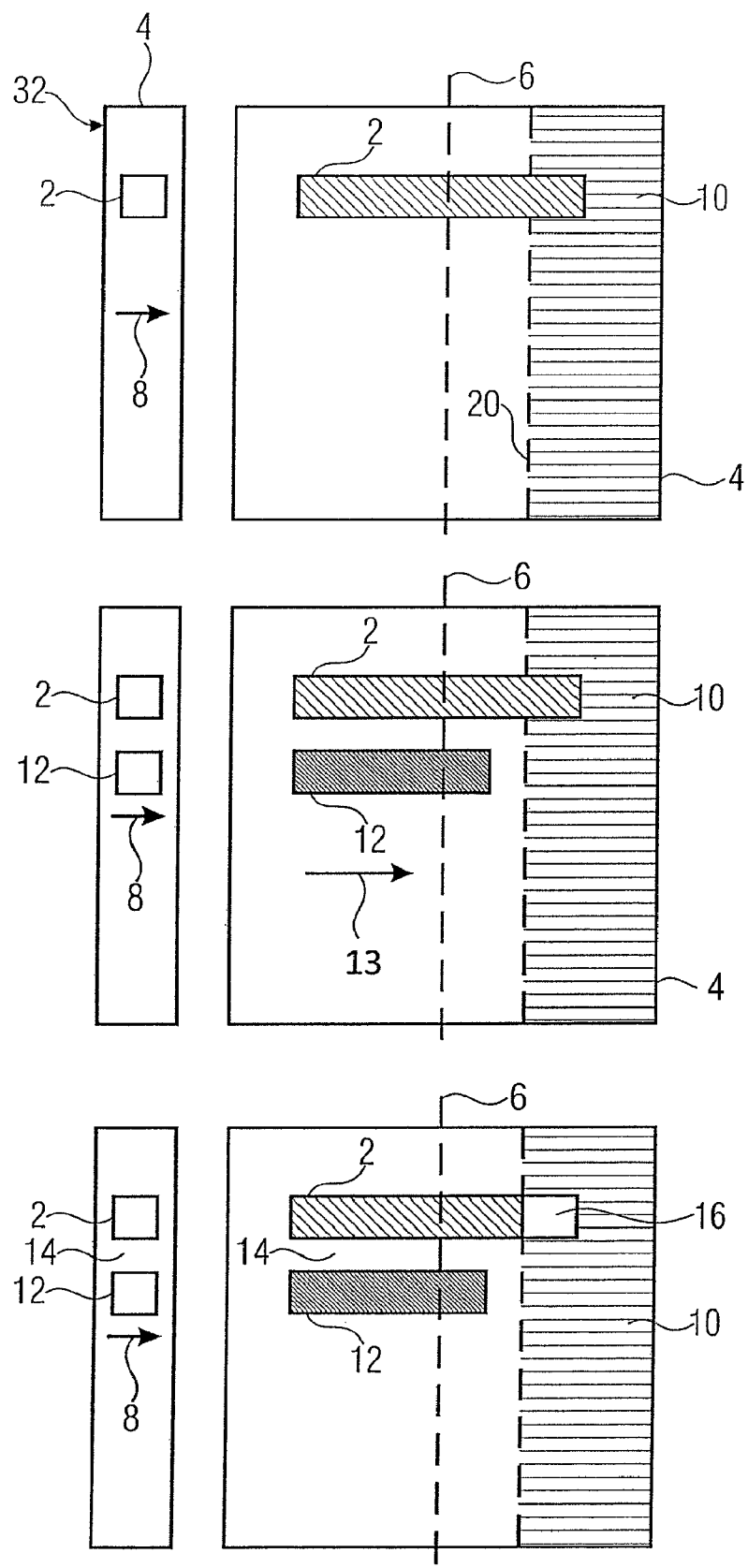
FIG. 1 shows an illustrative embodiment for providing a pressure sensor substrate.

FIG. 1 shows an illustrative embodiment of a method for providing a pressure sensor substrate 4. In the embodiment of FIG. 1, a single pressure sensor substrate is shown. However, in an alternate embodiment, multiple pressure sensor substrates may be produced at a time on the surface of a wafer.

A first cavity 2 may be created in the substrate 4. As it also becomes apparent from the cross-sectional view of the substrate 4 illustrated on the left side of the example of FIG. 1, the cavity 2 extends vertically, that is in a vertical direction 8 that is perpendicular (or normal) with respect to a main surface 32, inside the substrate. This schematic cross-sectional view is created along the cutting line 6 illustrated in FIG. 1. The cavity 2 is created inside the substrate 4, that is it is enclosed by material of the substrate, in particular also in the direction of the main surface 32 of the substrate 4. In this respect, the main surface 32 of the substrate 4 is to be understood as the surface which is visible in the face-on view of the substrate 4 in FIG. 1. As compared to the vertical direction 8, a horizontal direction shall be understood to be any direction which is basically perpendicular to the vertical direction 8, that is any direction basically parallel to the main surface 32 of the substrate 4.

The first cavity 2 extends horizontally into a venting area 10 of the substrate. In the embodiment of FIG. 1, the venting area 10 is rectangular. However, it goes without saying that the venting area 10 may have any other desirable geometry on the surface of the substrate 4.

Further, a second cavity 12 is created, which also extends vertically inside the substrate. The second cavity 12 also extends in parallel to the first cavity 2 in the predetermined direction 13. However, the second cavity 12 does not extend into the venting area 10.

The first cavity 2 is opened in the venting area 10. Thus, a opening 16 may be performed in the venting area 10 which allows the pressure to enter the cavity 2. As the second cavity 12 is closed, a reference pressure is maintained inside the second cavity 12. The altering pressure in the first cavity causes a deflection of a lamella 14, which is formed in between the two cavities 2 and 12 by the substrate. The deflection of the lamella can then be measured and evaluated in order to derive a pressure within the second cavity, that is a pressure of the surrounding atmosphere.

That is, sensing the deflection of the substrate between the first and second cavities allows to derive a measure of the pressure of the surrounding, which extends into the substrate via the opening of the first cavity.

All previously described steps may be implemented using standard semi-conductor processing techniques (e.g. CMOS). Therefore, the cavities and the lamella in between may be produced in the same substrate as the circuitry evaluating the deflection of the lamella 14 such that compact sensors may be produced. Furthermore, the additional cost arising from separately producing the sensor and the readout circuitry and the subsequent packaging of both components into a single package may be avoided.

By extending only one of the cavities into the venting area 10, the respective cavity may be opened without doing any further processing to the remaining substrate area, which comprises the second cavity 12 and possible readout circuitry. Therefore, possible harm to the remaining elements due to the required opening of the first cavity 2 can be avoided. The opening could, therefore be performed using any appropriate technique, such as etching, mechanical measures such as drilling, sawing or cutting, stealth dicing or other related techniques. The opening can be performed from any side, that is from the main surface, from the side or from the backside opposing the main surface.

The cavities may be created by first creating trenches within the substrate, and by then closing the trenches through the deposition of an oxide layer on top of the substrate. When the first cavity 2 is extended into the venting area 10, deep etching while creating the cavities and a subsequent thinning of the processed substrate 4 from the back side may be avoided, as it would be required when trying to open one of the cavities from the backside of substrate 4. This would require thinning the substrate to only few tenths of micrometers, risking the destruction of the sensor substrate 4 due to the additional mechanical stress applied to the substrate. Also the additional cost and processing steps which are non-standard CMOS-processes may be avoided as, for example, additional lithography from the backside of the substrate 4.

According to further embodiments, the first cavity may be opened by completely removing the venting area 4. To achieve this, the venting area 10 may be bordered by a singulation border 20. The substrate 4 is singulated along the singulation border 20 in order to remove the venting area. This may, for example, be achieved by etching, sawing, stealth dicing, or arbitrary other chemical or mechanical processes. Those embodiments may have the potential advantage that the first cavity 2 is automatically opened when the individual pressure sensor substrates 4 are singulated after the complete processing of a wafer when multiple pressure sensor substrates 4 are processed and created at a time on a surface of large wafer. That is, the opening may be automatically achieved, without necessarily risking any harm to the remaining process area of the pressure sensor substrate.

Although FIG. 1 illustrates a particular embodiment by way of example, in which the first cavity 2 extends beyond the singulation border 20 in the predetermined direction 13, which is the direction in which the first and second cavities 2 and 12 extend in parallel to each other, other embodiments may comprise cavities which extend into the venting area in any other arbitrary direction. For example, the first cavity may be elongated in a further direction forming a predetermined angle with respect to the predetermined direction 13, such as to enter the venting area 10 in the further direction.

Figure 2:
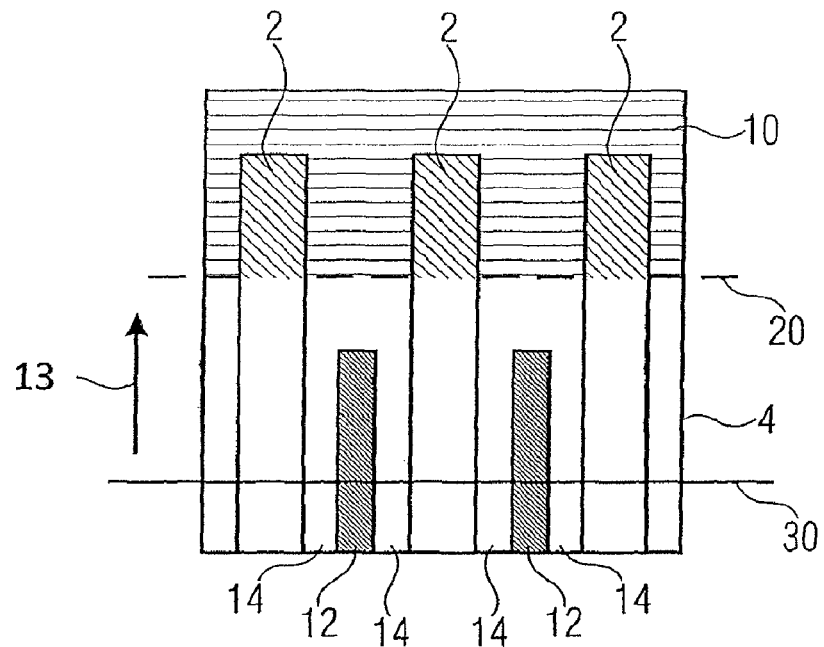
FIG. 2 illustrates a further illustrative embodiment for providing a pressure sensor substrate.

FIG. 2 shows an illustrative configuration according to a further embodiment of a method for producing a pressure sensor substrate.

According to the embodiment of FIG. 2, a pressure sensor substrate is produced which comprises multiple first and second cavities next to each other in order to increase the sensitive area of the chip or the pressure sensor substrate. Thus, multiple lamellas 14, first cavities 2 and second cavities 12, are created.

In the embodiment of FIG. 2, the first cavities 2 are created such, that they extend beyond the singulation border 20 into the venting area 10, whereas the second cavities 12, which are enclosed by first cavities 2 on either side, are created such that they do not extend beyond the singulation border 20.

By removing the substrate of the venting area 10 (singulating the pressure sensor substrate from a wafer), the first cavities 2 are opened at the sides of the substrate 4. That is, the pressure guiding cavities are opened without any need of further processing steps such as thinning or further etching.

Figure 3:
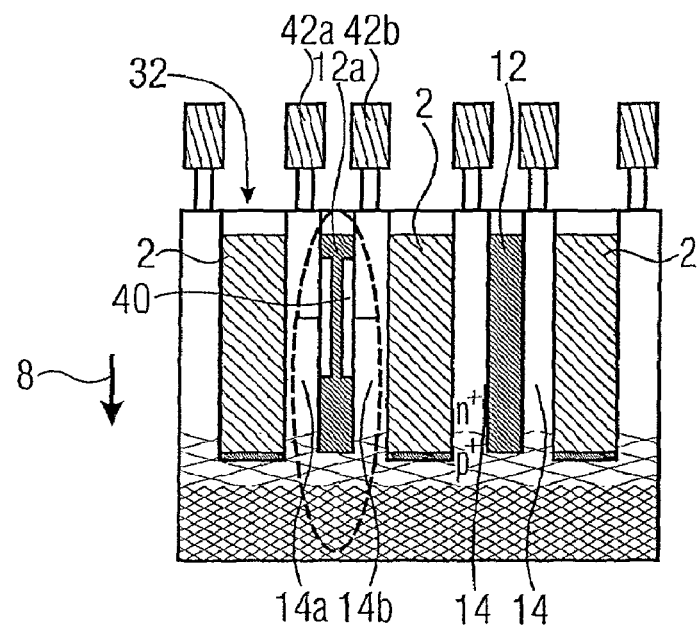
FIG. 3 illustrates an illustrative embodiment of a pressure sensor substrate.

FIG. 3 shows an illustrative embodiment of a pressure sensor substrate as it may be created by the method introduced with respect to, for example, FIGS. 1 and 2.

The pressure sensor substrate 4 in this example is shown in a projection along the cutting line 30 indicated in FIG. 2. It comprises a first cavity 2, which extends vertically with respect to a main surface 32 inside of the substrate. The pressure sensor substrate 4 furthermore comprises a second cavity 12, which also extends in the vertical direction 8 within the substrate. In the example shown in FIG. 3, the cavities are enclosed by an oxide layer in the direction of the main surface 32. This is due to the fact that, according to some embodiments, the cavities are created by first creating trenches within the substrate, and by then closing the trenches for example by the deposition of an oxide layer on top of the substrate.

The oxide could be replaced by any suitable material such as a dielectric. The first and second cavities also extend horizontally in a predetermined direction 13 within the substrate. It goes without saying that the substrate may be any appropriate semi-conductor substrate such as silicon, germanium or others. The vertical sidewalls of a first cavity 2 and its neighboring second cavity 12 define a lamella 14, which is deformed or deflected by the pressure difference between the pressure in the first and second cavities 2 and 12. In order to define a reference pressure, it may be that only the first cavities 2 are opened when the pressure sensor substrate 4 is singulated from the wafer. A deflection of the lamellas 14 may be measured and a pressure value may be derived from this measurement of the deflection. According to one particular example, a capacitance between the two vertical sidewalls of the second cavity 12 may be derived as a measure for the deflection of the two lamellas 14 enclosing the second cavity 12*a*.

To this end, contact pads 42*a* and 42*b* may be connected to the lamellas from the main surface 32 of the substrate 4, such as to be able to measure a capacitance between the two lamellas 14*a* and 14*b*. It goes without saying that the contact paths 42*a* and 42*b* illustrated in FIG. 3 are a mere example, which would allow the measurement of the capacitance. In further embodiments, the lamellas 14*a* and 14*b* may be connected to the readout circuitry through internal structures created in the course of the processing of the semi-conductor substrate.

In order to provide the capacitance, a p/n border may be created close to the bottom of the cavities, such as to avoid current flow through the substrate. To this end, a deep p-implant may be performed followed by a lower energy n-implant, as illustrated in FIG. 3, or vice versa. In other words, the process of creating a pressure sensor substrate may comprise the creation of an area which is sensitive to deflection inside the substrate between the first and second cavities. This may comprise, for example, the creation of a capacitance between the two vertical sidewalls of the second cavity 12*a*. According to further embodiments, other elements sensitive to deflection of the lamella 14 may be created, such as piezo resistors, stress sensitive transistors or the like.

Although the embodiments of FIG. 2 and FIG. 3 show cavities having different widths in the horizontal direction, other embodiments may be created in which the cavities 2 and 12 have identical widths. This is feasible, since the two cavities 2 and 12 may also be created with the same vertical extension, that is with the same depth in the vertical direction 8. This, in turn, is feasible by extending one of the cavities into the venting area 12 and by opening the cavity 12 in the venting area. Having cavities of equal width may ease the closing of the cavities by the oxide layer illustrated in FIG. 3.

Figure 4:
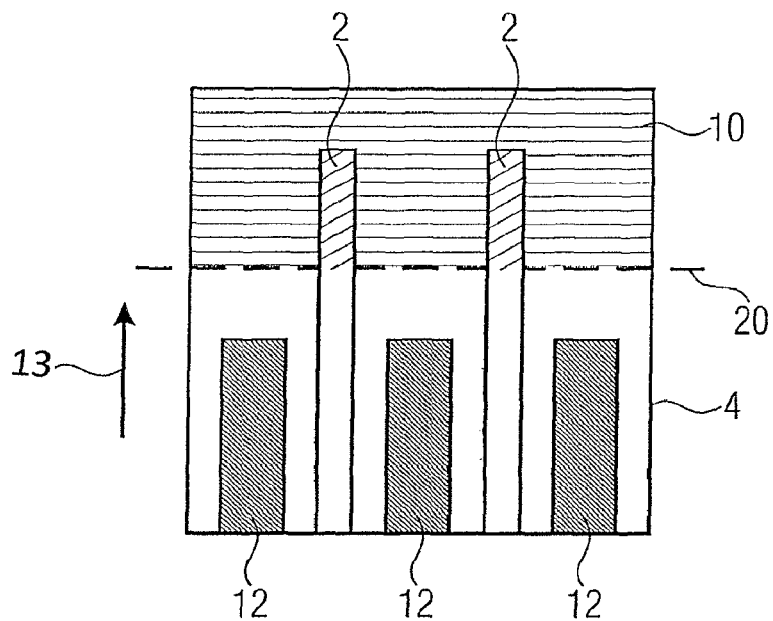
FIG. 4 illustrates a further illustrative embodiment for producing a pressure sensor substrate.

FIG. 4 shows a further illustrative embodiment of a method to provide a pressure sensor substrate, which is adapted to result with a differential pressure sensor.

According to the method illustrated in FIG. 4, the first cavities are not extended beyond the singulation border 30, whereas the second cavities 12 are extended beyond the singulation border 30. As compared to the embodiments of FIGS. 3 and 4, the first cavity 2 is of lower width than the second cavity 12. This however, is just an example. The width of the cavities could also be equal or the first cavity 2 could be wider than the second cavity 12. According to the embodiment illustrated in FIG. 4, a differential pressure sensor may be created, when the first cavity 2 is opened in the venting area (for example by cutting or singulating the pressure sensor substrate at the singulating border 30).

Figure 5:
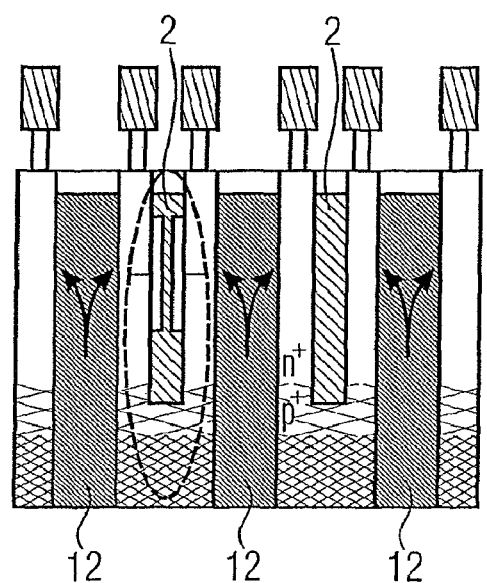
FIG. 5 illustrates a further illustrative embodiment of a pressure sensor substrate.

According to still further embodiments, one of which is illustrated by way of example in FIG. 5, differential pressure sensors may be created easily, that is, sensors comparing the pressure between two different reservoirs. To this end, the second cavity 12, which is fully enclosed in the embodiment of FIGS. 2 and 3, may also be opened.

This may, for example be achieved as illustrated in FIG. 5. The first cavity 2 is opened via the venting area 10. Furthermore, the second cavities 12 may also be opened, for example from the backside, as illustrated in FIG. 5. Thus, a differential pressure sensor can be easily implemented, which directly measures the difference of the pressure within the first cavities 2 and the second cavities 12. The sensing may be performed as previously illustrated in the embodiment of FIG. 3, that is by sensing a capacitance, a resistance change or the like.

According to further embodiments, a differential pressure sensor substrate may also be provided by additionally extending the second cavity 12 into a second venting area 40, and by then opening the second cavities 12 in the second venting area 40. That is, both cavities may be opened on different sides of the substrate without doing any harm to the remaining substrate such that differential pressure sensors can be easily implemented. The pressure opening is automatically provided on different sides of the substrate 4 such that the implementation of a so created pressure sensor substrate 4, that is the application of the pressure to the pressure sensor substrate, is simple since one only has to connect to the geometrically separated pressure openings of the first and second cavities, respectively.

Figure 6:
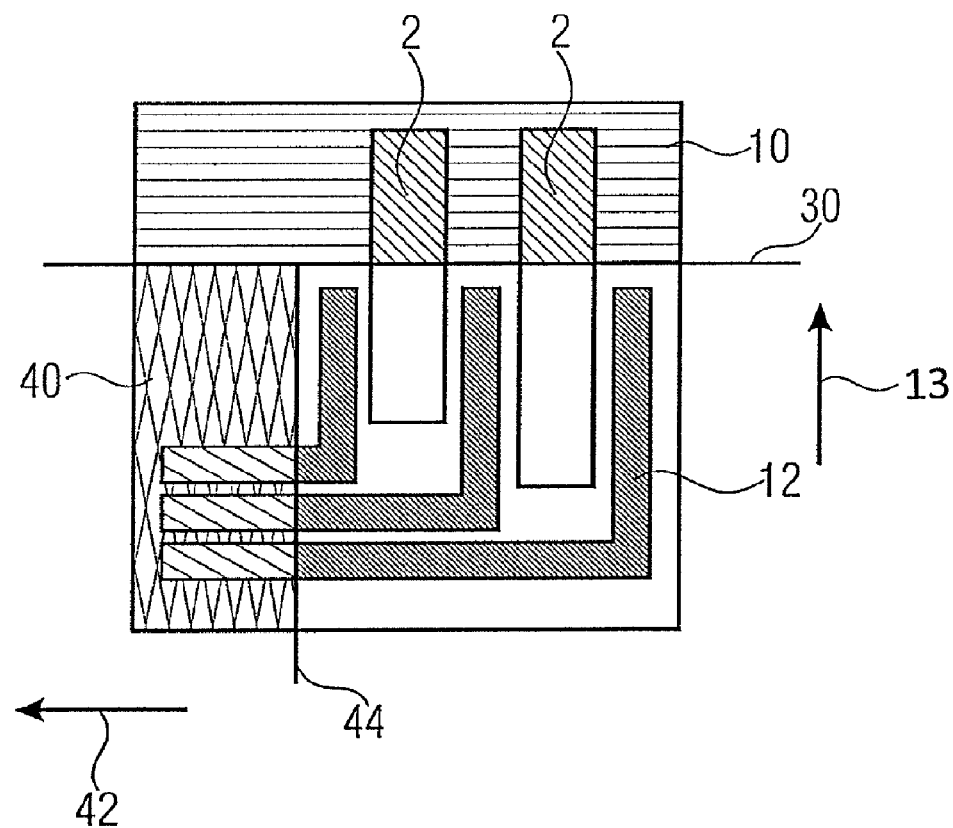
FIG. 6 illustrates a further illustrative embodiment for producing an embodiment of a pressure sensor substrate.

In the particular embodiment illustrated in FIG. 6, the second cavities 12 extend into the second venting area 40 in a predetermined second direction 42, crossing a second singulation border 44. When the second cavities 12 are opened in the second venting area 40, a differential pressure sensor may be implemented, which comprises cavities ventilated from different sides of the substrate. When the pressure sensor substrates are singulated along the singulating borders 30 and 44, the ventilation of the cavities is performed on the side faces of the pressure sensor substrate.

In the embodiment of FIG. 6, the predetermined direction 13 and the second predetermined direction 42 are perpendicular to each other. This is however, just an example of arbitrary possible geometries. For example, the first and second predetermined directions 13 and 42 may enclose such an angle with respect to each other, that also the second cavities extends into the first ventilation area 10. According to further embodiments, the second cavities 12 extend against the predetermined direction 13 to the other end of the pressure sensor substrate, such that the first and second cavities only extend along one common direction in parallel to each other. According to these embodiments, the ventilation would be provided on opposite side faces of the pressure sensor substrate.

The previously discussed embodiments may potentially allow the efficient implementation of differential pressure sensors. The singulation of the sensors may be performed by any appropriate technique, such as by cutting, sawing, etching or stealth dicing. In stealth dicing, a laser destroys the crystal-structure in a predetermined depth of the substrate, such that the substrate may be singulated (for example by breaking the substrate) such that the cavities of the substrate can be reliably opened and ventilated.

Alternatively or additionally, the side face (edge) created by the singulation process may also be defined by etching a trench. The etching of this trench may also be performed simultaneously to the etching of the trenches forming the cavities, such that no additional processing steps are required.

As previously indicated, various illustrative embodiments as described herein provide a pressure sensor substrate where the cavities are ventilated on the side faces of the active chip area, such that they form a pressure channel (a cavity allowing the pressure to enter the substrate) after the singulation of the individual pressure sensor substrates. According to further embodiments, it may be that only the first cavities are ventilated through the side faces of the pressure sensor substrate, whereas the second cavities are opened from the main surface or from the back surface, which is opposite to the main surface, of the pressure sensor substrate.

The previously discussed embodiments may potentially provide flexibility in creating pressure sensors, since the ventilation of the cavities may be performed in a dedicated ventilation area, outside of the active area of the pressure sensor. This may potentially allow for the production of pressure sensors also implementing the readout circuitry on one single chip. Furthermore, the ventilation in the dedicated ventilating areas may potentially allow for increased, or even maximum, flexibility in choosing the parameters of the cavities and the lamellas of the sensor.

In particular, first and second cavities are feasible, which can both be ventilated, and at the same time be of the same width and depth. According to some illustrative embodiments, the width of the cavity may be in the range of, e.g., 5 nanometers to 10 micrometers, inclusive. According to further illustrative embodiments, the width of the cavity may be in the range of, e.g., 5 nanometers to 150 nanometers, inclusive. According to further illustrative embodiments, the width of the cavity may be in the range of, e.g., 50 nanometers to 1 micrometer, inclusive. However, these ranges are merely examples, and other cavity widths may be provided.

According to some illustrative embodiments, the width of the lamellas, that is the width of the substrate area between the parallel portions of the first and second cavities, may be in the range of, e.g., 5 nanometers to 10 micrometers, inclusive. According to further illustrative embodiments, the width of the lamellas may be in the range of, e.g., 5 nanometers to 150 nanometers, inclusive. According to further illustrative embodiments, the width of the lamellas may be in the range of, e.g., 50 nanometers to 1 micrometer, inclusive. However, these ranges are merely examples, and other lamella widths may be provided.

The invention claimed is:

1. A method for providing a pressure sensor substrate, comprising:
   creating a first cavity that extends inside the substrate in a first direction perpendicular to a main surface of the substrate, and that extends inside the substrate, in a second direction perpendicular to the first direction, into a first venting area of the substrate;
   creating a second cavity that extends in the first direction inside the substrate, that extends in parallel to the first cavity in the second direction, and that does not extend into the first venting area;
   opening the first cavity in the first venting area; and
   wherein the substrate forms a lamella between the first cavity and the second cavity, wherein the lamella is configured such that a pressure difference between the first cavity and the second cavity causes a measurable deflection of the lamella.

2. The method of claim 1, wherein creating the first and second cavities comprises:
   creating a first trench extending in the first direction into the substrate;
   creating a second trench extending in the first direction into the substrate; and
   closing the first and the second trenches.

3. The method of claim 2, in which closing comprises depositing a dielectric on the substrate.

4. The method of claim 1, wherein the first cavity is created such that the first cavity extends beyond a singulation border in the second direction, the singulation border being a border of the first venting area, and
wherein the second cavity does not extend beyond the singulation border in the second direction.

5. The method of claim 4, further comprising performing singulation of the substrate at the singulation border.

6. The method of claim 5, wherein performing the singulation comprises at least one of the following: sawing, cutting, edging, and stealth dicing at the singulation border.

7. The method of claim 1, wherein the first and second cavities are created with a same width in the second direction.

8. The method of claim 1, wherein the first and second cavities are created such that they extend by a same depth in the first direction.

9. The method of claim 1, wherein the first and second cavities are created with a width that is in a range of 5 nanometers to 10 micrometers, inclusive.

10. The method of claim 1, wherein the pressure sensor substrate is configured such that a capacitance between two parallel sidewalls of a portion of the second cavity that extends in parallel to the first cavity changes in response to a deflection between the first and second cavities and inside of the substrate.

11. The method of claim 1, wherein the second cavity is created such that it furthermore extends into a second venting area, wherein the first cavity is created such that it does not extend into the second venting area, the method further comprising opening the second cavity in the second venting area.

12. The method of claim 11, further comprising performing singulation of the substrate at a second singulating border, the second singulating border being a border of the second venting area.

13. A method for providing a pressure sensor substrate, comprising:
creating a first cavity that extends inside the substrate in a first direction perpendicular to a main surface of the substrate, and that extends inside the substrate, in a second direction perpendicular to the first direction, into a first venting area of the substrate; and
creating a second cavity that extends in the first direction inside the substrate, that extends in parallel to the first cavity in the second direction, and that does not extend into the first venting area,
wherein the parallel portions of the first and second cavities are created with a distance with respect to each other that is in a range of 5 nanometers to 10 micrometers, inclusive.

14. A pressure sensor substrate, comprising:
a first venting area of the substrate;
a first cavity extending inside the substrate in a first direction perpendicular to a main surface of the substrate, the first cavity also extending inside the substrate in a second direction perpendicular to the first direction into the first venting area of the substrate;
a second cavity extending inside the substrate in the first direction, the second cavity also extending in parallel to the first cavity in the second direction, the second cavity not extending into the first venting area; and
a lamella formed by the substrate between the first cavity and the second cavity, wherein the lamella is configured such that a pressure difference between the first cavity and the second cavity causes a measurable deflection of the lamella,
wherein the first cavity is open to a surrounding environment outside the pressure sensor substrate by way of the first venting area.

15. The pressure sensor substrate of claim 14, wherein the first cavity extends in the second direction up to a side face of the pressure sensor substrate, and wherein the second cavity does not extend to the side face of the pressure sensor substrate in the second direction.

16. The pressure sensor substrate of claim 14, wherein the first and second cavities have a same width in the second direction.

17. The pressure sensor substrate of claim 14, wherein the first and second cavities extend by a same depth in the first direction.

18. The pressure sensor substrate of claim 14, wherein the first and second cavities each have a width in the second direction that is in a range of 5 nanometers to 10 micrometers, inclusive.

19. The pressure sensor substrate of claim 14, wherein the pressure sensor substrate is configured such that a capacitance between two parallel sidewalls of a portion of the second cavity that extends in parallel to the first cavity changes in response to a deflection between the first and second cavities and inside of the substrate.

20. The pressure sensor substrate of claim 14, wherein the second cavity furthermore extends in the second direction into a second venting area, wherein the first cavity does not extend into the second venting area, and wherein the second cavity is opened into the second venting area.

21. A pressure sensor substrate, comprising:
a first venting area of the substrate;
a first cavity extending inside the substrate in a first direction perpendicular to a main surface of the substrate, the first cavity also extending inside the substrate in a second direction perpendicular to the first direction into the first venting area of the substrate; and
a second cavity extending inside the substrate in the first direction, the second cavity also extending in parallel to the first cavity in the second direction, the second cavity not extending into the first venting area,
wherein the first cavity is open to a surrounding environment outside the pressure sensor substrate by way of the first venting area, and
wherein the parallel portions extending in the second direction of the first and second cavities have a distance with respect to each other that is in a range of 5 nanometers to 10 micrometers, inclusive.

22. A method for providing a pressure sensor substrate, comprising:
creating a first cavity that extends inside the substrate in a first direction perpendicular to a main surface of the substrate, and that extends inside the substrate, in a second direction perpendicular to the first direction, over a first singulation border;
creating a second cavity that extends in the first direction inside the substrate, that extends in parallel to the first cavity in the second direction, and that does not extend over the first singulation border; and
performing singulation of the substrate at the first singulation border.

23. The method of claim 22, wherein the second cavity extends in a third direction perpendicular to the first direction over a second singulation border, wherein the first cavity does not extend over the second singulation border, and wherein the method further comprises performing singulation of the pressure sensor substrate at the second singulation border.

24. The method of claim 22, further comprising opening the second cavity to a surface of the substrate that is opposite the main surface of the substrate.

25. A pressure sensor substrate, comprising:
- a first cavity extending inside the substrate in a first direction perpendicular to a main surface of the substrate, the first cavity also extending inside the substrate in a second direction perpendicular to the first direction up to a side face of the pressure sensor substrate;
- a second cavity extending inside the substrate in the first direction, the second cavity also extending in parallel to the first cavity in the second direction, the second cavity not extending in the second direction up to the side face of the pressure substrate; and
- a lamella formed by the substrate between the first cavity and the second cavity, wherein the lamella is configured such that a pressure difference between the first cavity and the second cavity causes a measurable deflection of the lamella.

26. The pressure sensor substrate of claim 25, wherein the second cavity extends in a third direction perpendicular to the first direction up to the side face of the pressure sensor substrate.

* * * * *